US006025741A

United States Patent [19]

Ciraula et al.

[11] Patent Number: 6,025,741

[45] Date of Patent: Feb. 15, 2000

[54] CONDITIONAL RESTORE FOR EXECUTION UNIT

[75] Inventors: Michael Kevin Ciraula, Round Rock; George McNeil Lattimore; Gus Wai-Yan Yeung, both of Austin, all of Tex.

[73] Assignee: International Business Machines Corporation, Armonk, N.Y.

[21] Appl. No.: 08/772,643

[22] Filed: Dec. 23, 1996

[51] Int. Cl.[7] .................... H03K 19/00

[52] U.S. Cl. .................... 326/93; 326/98

[58] Field of Search .................... 326/93, 95, 98

[56] References Cited

U.S. PATENT DOCUMENTS

| | | | |
|---|---|---|---|
| 4,972,377 | 11/1990 | Lee | 365/226 |
| 5,003,501 | 3/1991 | Podkowa | 364/569 |
| 5,144,166 | 9/1992 | Camarota et al. | 326/41 |
| 5,191,554 | 3/1993 | Lee | 365/226 |
| 5,347,472 | 9/1994 | Podkowa | 364/569 |
| 5,550,490 | 8/1996 | Durham et al. | 326/98 |
| 5,760,610 | 6/1998 | Naffziger | 326/93 |

*Primary Examiner*—Jon Santamauro
*Attorney, Agent, or Firm*—Anthony V. S. England; Jack V. Musgrove; Andrew J. Dillon

[57] ABSTRACT

A circuit for conditionally restoring an execution unit in a computer processor, to reduce power consumption. Execution units, such as an arithmetic logic unit, shift/rotate unit, multiply unit, etc., have bits in transit that flow through a series of logic gates. These gates must be precharged after an operation has occurred to prepare the unit for the next operation. The conditional restore circuit evaluates either the data input to the execution unit, or the data output from the execution unit, to determine whether an operation has occurred. The precharge device for the execution is turned on only when the evaluation indicates that an operation has just occurred. The circuit includes an AND gate whose output controls the precharge device, and whose inputs include one line from the evaluation circuit, and one line for cycling (the system clock). In an embodiment wherein the execution unit has two operand multiplexers which receive the data input, the evaluation circuit includes two select line respectively connected to the multiplexers, and to inputs of the AND gate. In an alternative embodiment wherein the execution unit has data output in the form of a TRUE line and a COMPLEMENTARY line, the evaluation circuit includes a NOR gate means having a first input connected to said TRUE line, a second input connected to said COMPLEMENTARY line, and an output connected to said first input of the AND gate.

10 Claims, 7 Drawing Sheets

CONDITIONAL RESTORE FOR EXECUTION UNIT

BACKGROUND OF THE INVENTION

1. Field of the Invention

The present invention generally relates to computer systems, and more particularly to electrical power consumption by memory arrays such as static random access memory. The present invention is directed to a method and device for conserving power required by restore operations for the memory array.

2. Description of the Prior Art

Conventional computers use several pieces of interconnected hardware, including input/output devices for the user interface (such as a keyboard and display), a permanent storage device (such as a magnetic or optical disk), a temporary memory device (such as random access memory or RAM), and a central processing unit (CPU or processor) which accesses the permanent storage and temporary memory when carrying out program instructions. The present invention relates to power consumption by these devices, particularly by temporary memory devices such as RAM, and execution units in the CPU, such as an arithmetic logic unit.

There are basically three types of RAM: dynamic RAM, static RAM, and pseudo-static RAM. Dynamic RAM stores data in capacitors, that is, it can hold data for only a few milliseconds, so DRAM is typically refreshed (precharged) using external refresh circuitry. Pseudo-static RAM is like DRAM with internal refresh circuitry. Static RAM is a read-write memory array whose storage cells are typically made up of four or six transistors forming flip-flop elements that indefinitely remain in a given binary state (i.e., 1 or 0, corresponding respectively to high or low voltage states) until the information in the cell is intentionally changed, or the power to the memory circuit is shut off, so this memory does not need to be regularly refreshed. It is only necessary to restore (electrically precharge) the SRAM array after or before each evaluation (read or write operation). In a traditional (sense amplifier) memory array, the complete array is restored even though only a small segment of the array is being accessed, resulting in excess power consumption by the array. In addition, the entire array is restored every clock cycle or by some other form of periodic signal and will therefore be restored even if the array is idle (no read/write). Although power considerations are not significant for mainframe or desktop computers, there is a continual attempt to reduce overall power consumption in portable computers that often run on batteries.

In some prior art SRAM designs such as those referred to as a clocked dynamic array, the memory array is broken into groups of "bit lines." See, e.g., U.S. Pat. Nos. 4,972,377 and 5,191,554. In this way, only the group containing the memory location to be accessed is required to be restored. If such a scheme were employed, it would conserve power. These prior designs still require the entire array, i.e., all groups of bit lines, to be restored every clock cycle even if the array is idle (no read or write operations), and the SRAM is usually not accessed every cycle (e.g., a level 2 cache), so this requires additional, unneeded power. It would, therefore, be desirable to devise a method of reducing power consumption by conditionally restoring only the accessed segments of static RAM. It would be further advantageous if the method were also applicable to other circuit functions in the computer system, such as execution units in the CPU.

SUMMARY OF THE INVENTION

It is therefore one object of the present invention to provide an improved method to reduce power consumption in circuit functions such as execution units for computer processors.

It is another object of the present invention to provide such a method which does not require restoring the execution unit when it is idle.

It is yet another object of the present invention to provide such a method which can be easily implemented with conventional designs for execution units.

The foregoing objects are achieved in a conditional restore circuit comprising means for periodically evaluating the execution unit to determine whether it has performed an operation, and means for restoring the execution unit if the evaluating means determines that the execution unit has performed the operation. The restoring means includes gate means (such as an AND gate) having a first input connected to an output of said evaluating means, a second input connected to a system clock, and an output connected to the execution unit for activating a precharge device in the execution unit. In an embodiment wherein the evaluating means evaluates the data input to the execution unit, the execution unit has first and second operand inputs emanating, respectively, from first and second operand multiplexers which receive the data input, and the evaluating means includes a first select line connected to the first operand multiplexer and the first input of the gate means, and a second select line connected to the second operand multiplexer and a third input of the gate means. The execution unit can be prevented evaluating (and consequently being precharged), by de-asserting all selects to the operand multiplexers, and power consumption by the restore phase (clock switching, etc.) is eliminated by gating the restore clock with the select signals. In an embodiment wherein the evaluating means evaluates the data output from the execution unit, the execution unit has data output in the form of a TRUE line and a COMPLEMENTARY line, and the evaluating means includes a NOR gate having a first input connected to the TRUE line, a second input connected to the COMPLEMENTARY line, and an output connected to the first input of the gate means, providing similar gating of the restore clock.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 3:
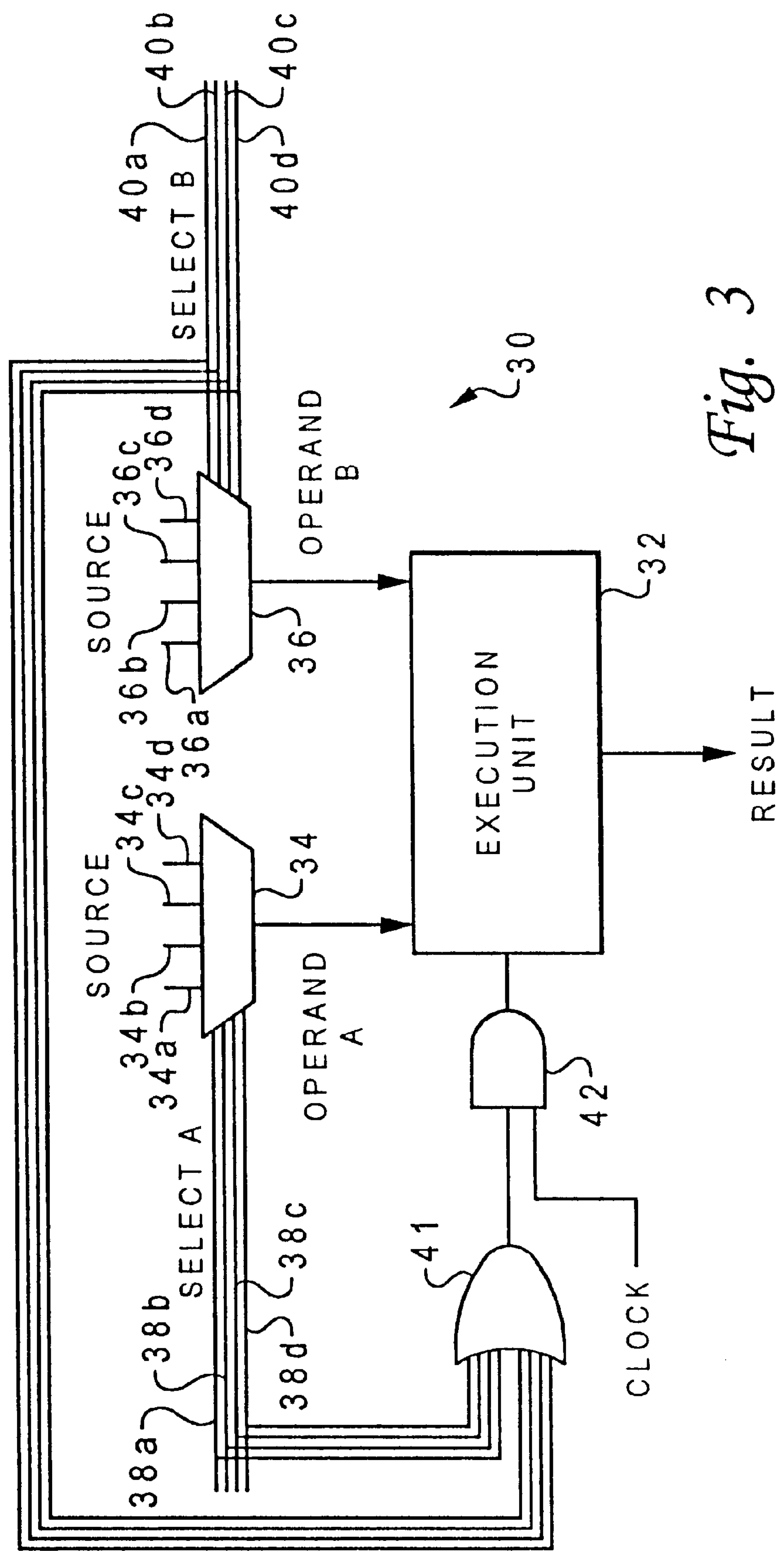
FIG. 3 is a block diagram of one embodiment of the present invention corresponding to the conditional restore circuit of FIG. 1, for precharging an execution unit in a computer processor.
Figure 4:
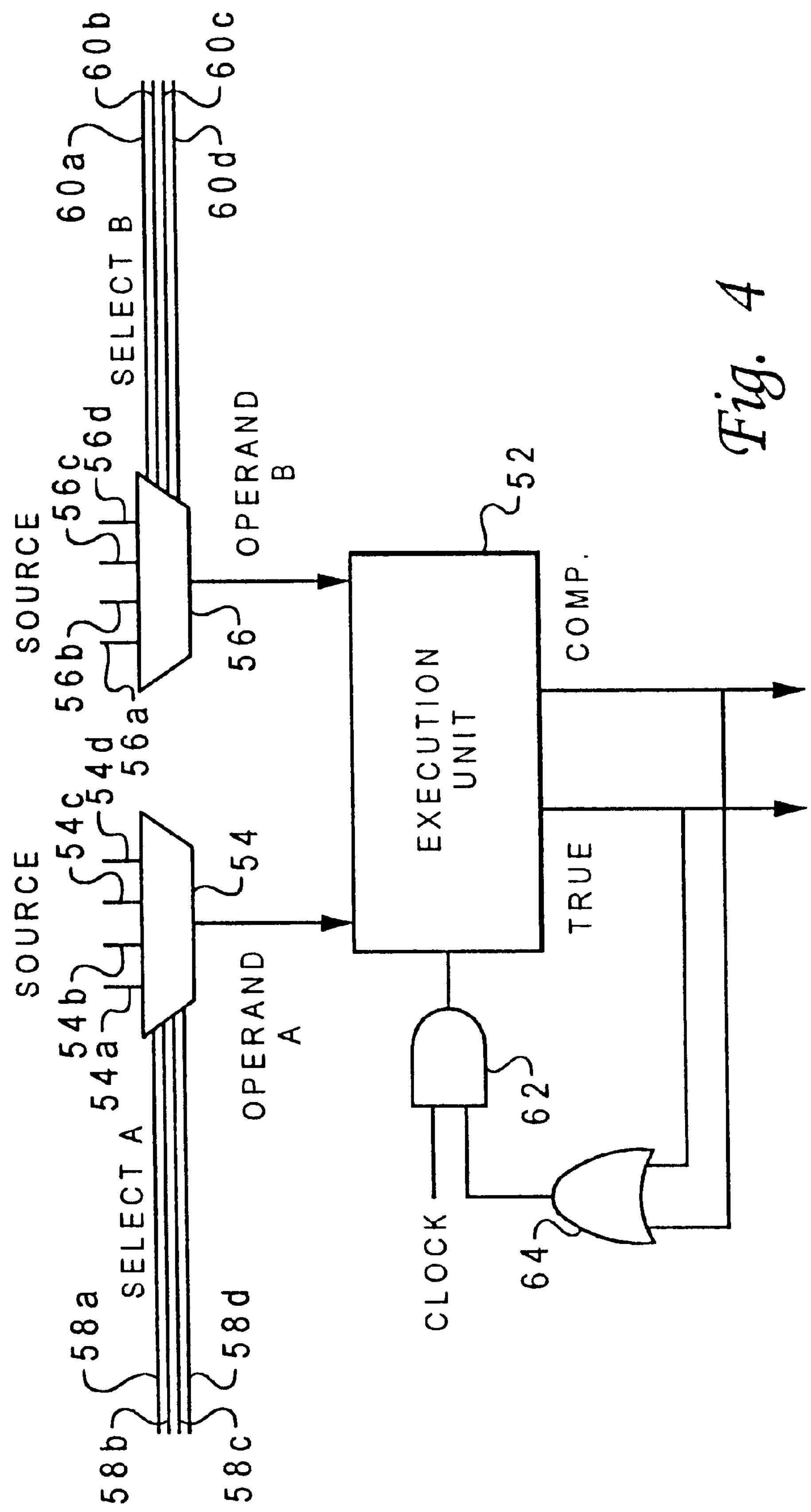
FIG. 4 is a block diagram of another embodiment of the present invention corresponding to the conditional restore circuit of FIG. 2, for precharging an execution unit in a computer processor.
Figure 5:
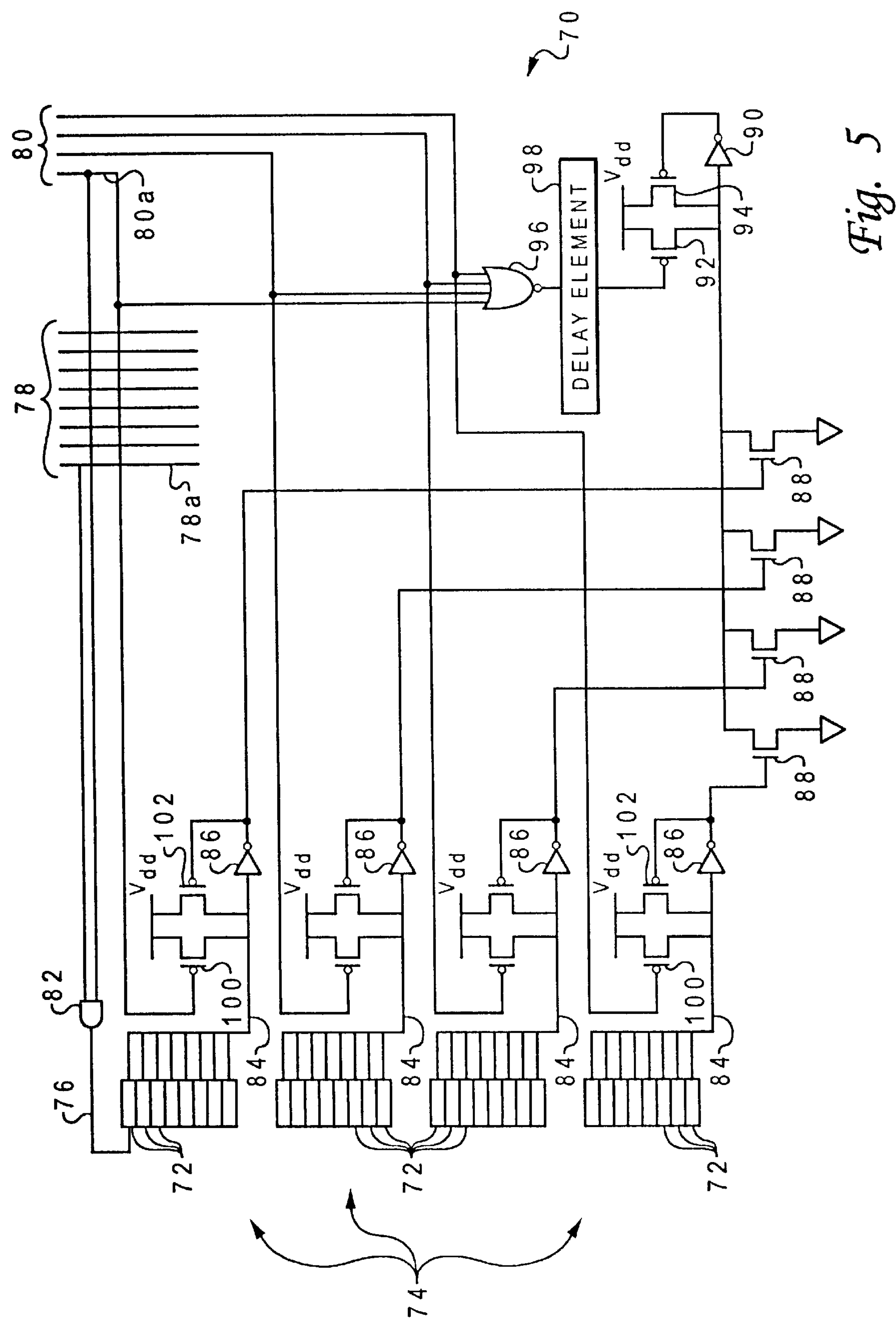
FIG. 5 is a schematic diagram of yet another embodiment of the present invention corresponding to the conditional restore circuit of FIG. 1, for precharging a memory cell in a random access memory array.
Figure 6:
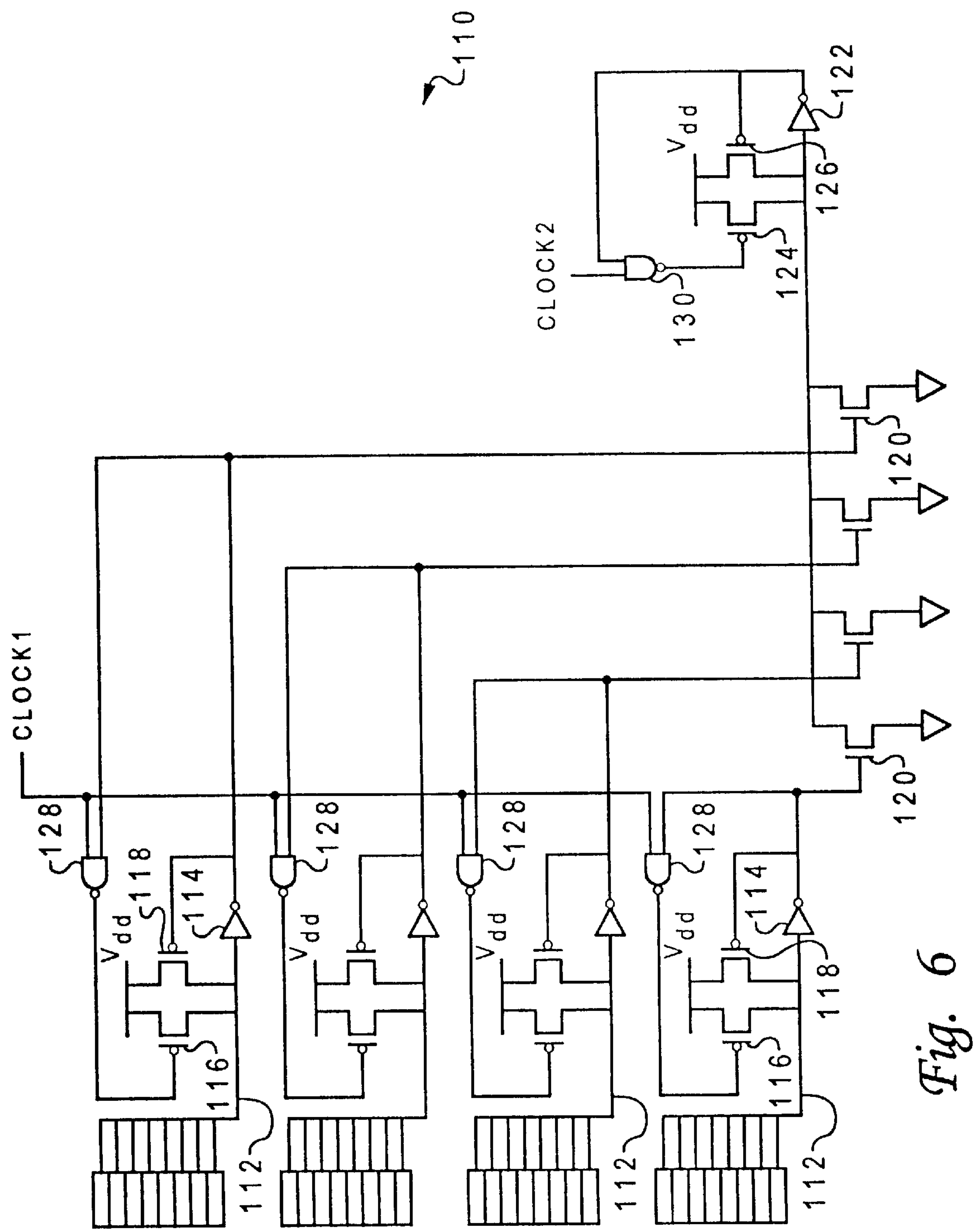
FIG. 6 is a schematic diagram of still another embodiment of the present invention corresponding to the conditional restore circuit of FIG. 2, for precharging a memory cell in a random access memory array.

The present invention is directed to a computer system having components which require electrical restoration, or precharging, such as the dynamic bit lines in a memory array (like random access memory) or an execution unit (like an arithmetic logic unit) in a computer processor. These components are examined in order to determine when they have been accessed, so as to minimize power consumption by allowing the restore to occur only when the component has actually been accessed. As explained further below, there are two primary approaches to examining the components, one involving repeated examination of the incoming control logic (FIGS. 1, 3 and 5), and the other involving repeated examination of the data output of the component (FIGS. 2, 4, and 6).

Figure 1:
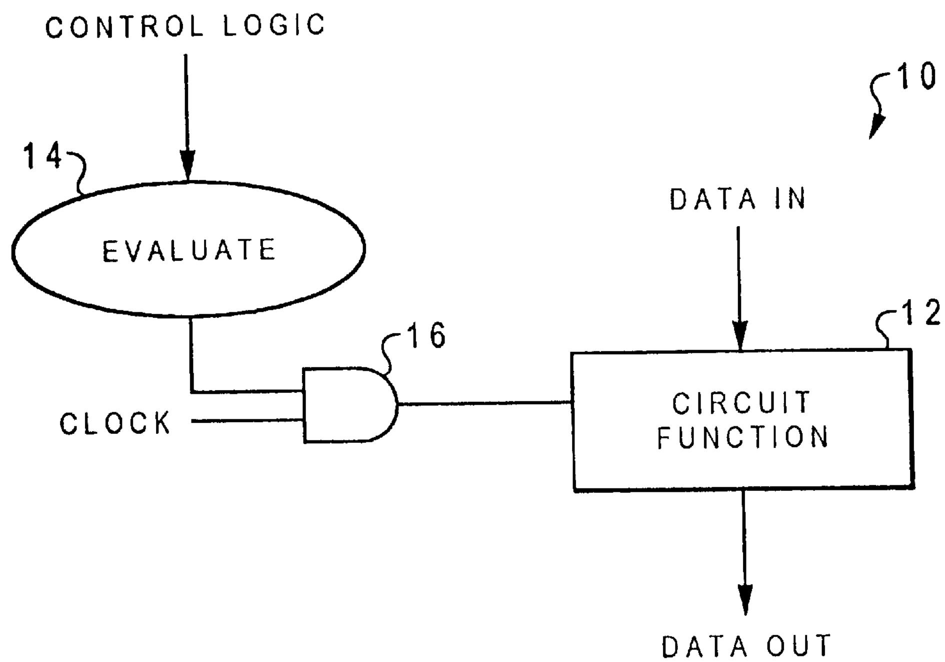
FIG. 1 is a representation of a conditional restore circuit which precharges a circuit function based on control logic associated with the data input to the circuit function.

With reference now to the figures, and in particular with reference to FIG. 1, there is depicted one embodiment 10 of the conditional restore circuit of the present invention. Conditional restore circuit 10 is comprised of a generalized circuit function 12 (which, as explained in conjunction with FIGS. 3 and 5, can be any one of a number of devices such as an execution unit or a memory array), an evaluate circuit 14, and means for restoring circuit function 12, the restoring means comprising a gate 16 which examines the output of evaluate circuit 14 every clock cycle. Evaluate circuit 14 has as its input control logic which is related to the data that is fed into circuit function 12. Every clock cycle, evaluate circuit 14 periodically determines whether circuit function 12 has been accessed based on the control logic. If it has, then the output of gate 14 turns on to precharge circuit function 12. In this manner, circuit function 12 is restored only when necessary. In this embodiment, neither gate 16 nor evaluate circuit 14 are connected in any manner to the output of circuit function 12. The same idea can be alternatively implemented by keeping circuit function 12 held in precharge until released by the evaluate circuit.

Figure 2:
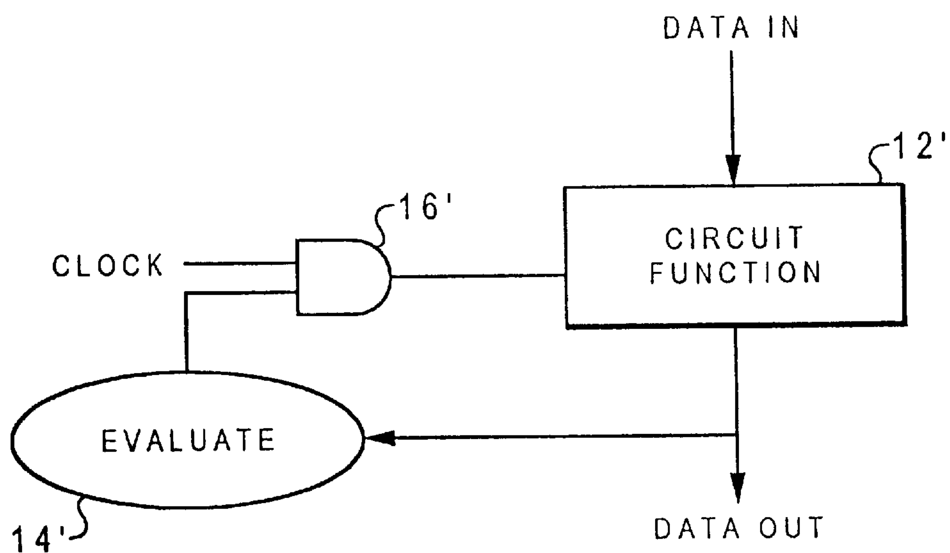
FIG. 2 is a representation of another conditional restore circuit, which precharges a circuit function based on data output from the circuit function.

Referring to FIG. 2, another embodiment 20 of the conditional restore circuit of the present invention is illustrated in which an evaluate circuit 14' has as its input the data output of a generalized circuit function 12'. Evaluate circuit 14' is connected in turn to a gate 16' which again has another input from the system clock, and an output adapted to restore circuit function 12'. Every clock cycle, evaluate circuit 14' determines whether circuit function 12' has been accessed based on its output value and similarly causes gate 16' to precharge circuit function 12' only when necessary. In this embodiment, neither gate 16' nor evaluate circuit 14' are connected in any manner to the data input (or incoming control logic) to circuit function 12'.

Two further examples are given for each of the general circuits of FIGS. 1 and 2. FIG. 3 represents a conditional restore circuit for an execution unit which is responsive to incoming control logic, and FIG. 4 represents a conditional restore circuit for an execution unit which is responsive to the output of the execution unit. FIG. 5 represents a conditional restore circuit for a random access memory (RAM) array which is responsive to incoming control logic, and FIG. 6 represents a conditional restore circuit for a RAM array which is responsive to data output from the array.

With further reference to FIG. 3, the depicted conditional restore circuit 30 is adapted to restore an execution unit 32 in a central processing unit (CPU). Those skilled in the art will appreciate that there are a variety of such execution units used in conventional processors that can take advantage of the present invention, including arithmetic logic units (ALUs), shift/rotate units, multiply units, etc., having bits in transit that flow through a series of logic gates. Two inputs (operands A and B) are used to access and manipulate execution unit 32. These inputs to execution unit 32 are outputs of respective multiplexers 34 and 36, which in turn have as inputs a plurality of source lines 34*a*, 34*b*, 34*c* and 34*d*, and 36*a*, 36*b*, 36*c* and 36*d*, respectively. The source lines carry the information required to operate execution unit 32, such as an instruction, data value, or address. Source lines 34*a*–34*d* and 36*a*–36*d* can be any size (width), e.g., 32 bits. The multiplexers 34 and 36 also have respective select lines 38*a*, 38*b*, 38*c* and 38*d*, and 40*a*, 40*b*, 40*c* and 40*d* which activate the multiplexers so that, when the select lines are de-asserted, the multiplexers and execution unit 32 are idle. Select lines 38*a*–38*d* and 40*a*–40*d* are inputs to an OR gate 41 whose output is one input to an AND gate 42, having a second input which is connected to the system clock. In this manner, it is possible to prevent execution unit 32 from evaluating (and consequently being precharged), by de-asserting all selects to the operand multiplexers. Although the execution unit would be idle for that particular cycle, power would still be consumed by the restore phase (clock switching, etc.) if it were not for gate 42. Restore power can be eliminated by gating the restore clock with the select signals. Thus, the restore operation is performed only if execution unit 32 has been previously (immediately) evaluated. Clock power used by this method is insignificant since it only goes to one gate per execution unit.

In FIG. 4, a similar conditional restore circuit 50 is adapted to restore an execution unit 52 by means of data feedback. Two inputs (operands A and B) are again used to manipulate execution unit 52, the inputs emanating from respective multiplexers 54 and 56. The multiplexers again have as inputs a plurality of source lines 54*a*, 54*b*, 54*c* and 54*d*, and 56*a*, 56*b*, 56*c* and 56*d*, and have respective select lines 58*a*, 58*b*, 58*c* and 58*d*, and 60*a*, 60*b*, 60*c* and 60*d*. Another AND gate 62 is provided but, in this embodiment, select lines 58*a*–58*d* and 60*a*–60*d* are not connected to the gate. Rather, gate 62 combines the restore clock with the output of an OR gate 64 that has as its inputs the two outputs (TRUE and COMPLEMENT) from execution unit 52. In this manner, it is again possible to prevent execution unit 32 from evaluating by de-asserting all selects to the operand multiplexers, and further to eliminate gating the restore clock by watching for a valid result from execution unit 52. When execution unit 52 has been precharged, its outputs are both initially set to zero; immediately after execution unit 52 performs an evaluation, and, the result of the evaluation (zero or one) is sent to the TRUE output, and the opposite value is sent to the COMPLEMENT output. The following table describes the resulting output of OR gate 64 and the resulting restore decision:

TABLE 1

| TRUE signal | COMP. signal | NOR gate | restore operation |
|---|---|---|---|
| 0 | 0 | 0 | not evaluated |
| 0 | 1 | 1 | evaluated |
| 1 | 0 | 1 | evaluated |
| 1 | 1 | 1 | invalid |

In other words, if both signals are zero, execution unit 52 has not evaluated and does not need to be restored. If both signals are one, this indicates an error, but the circuit will restore execution unit 52 anyway, in case an evaluation has occurred. This circuit is an improvement over the use of sense amplifiers for restoring circuits, because a sense amp cannot recognize if both inputs are in the same state (zero). There are numerous ways to indicate completion of a logic function, and the foregoing is but one example.

With reference now to FIG. 5, yet another conditional restore circuit 70 is shown, which is adapted to selectively restore a plurality of memory cells (bits) 72 in a memory array, such as a static random access memory (SRAM). Memory cells 72 can be arranged in various groups, such as 8-bit groups 74. These smaller groups may be further arranged into larger groups, such as the 32-bit column formed by the four depicted groups 74. The number of bits or cells in these groups is arbitrary, i.e., the smallest group 74 could have more or less than 8 bits, and a column could include any number (two or more) of the smaller groups, so the depicted embodiment should not be construed in a limiting sense.

Each cell 72 has a unique "word line" connected thereto, with an associated memory address. In FIG. 5, only one word line 76 is shown for the sake of clarity. Memory bytes can be constructed using multiple columns wherein a single bit in each column is associated with a given memory address, i.e., a given word line is connected to one bit in each column (those memory cells in the same "row"). For example, a 16-bit byte output would require 16 of the columns illustrated in FIG. 5, so there would be 32 total bytes with each byte having 16 bits. The circuit of FIG. 5 can accordingly be expanded to any word sizes. Also, multiplexing can be added to the output stages if more depth of memory is required.

A word line is selected by a decoder which includes a first plurality of predecoded address lines 78, a second plurality of predecoded address lines 80, and a plurality of AND gates whose inputs are pairs of lines, one each from the groups 78 and 80. For example, the depicted word line 76 is the output of a gate 82 having two inputs, one being line 78*a* from group 78 which has 8 lines, and the other being line 80*a* from group 80 which has 4 lines. In this manner, word line 76 is turned on when lines 76 and 78 are both turned on. Only one line in each group 78, 80 is turned on, so the 32 cells 72 can be individually selected based on a total of 12 lines (8×4). One of the two groups (e.g., 80) can be used to indicate which one of the four 8-bit groups 74 are about to be accessed. Those skilled in the art will appreciate that the use of AND gate 82 is exemplary since other devices, such as a NOR gate, a NAND gate, or an AND gate with one input inverted, could also be used, depending on how the decoder addresses are designed.

There are also multiple bit lines 84 connected to the memory cells, one bit line for each of the groups 74. Each bit line 84 is connected to an individual restore circuit, described below. Since the bit lines are thus broken into multiple segments, only those accessed segments corresponding to the evaluated memory addresses are required to be restored. There are several ways which these bit lines may be conditionally accessed to restore the array. Two methods are shown in FIGS. 5 and 6.

In the method of FIG. 5, the restore is conditionally turned OFF. In other words, the array is kept at the restore state, and restore is turned off only for the accessed segment, based on the word line generated by decoding the predecoded address lines in groups 78 and 80. The bit lines 84 are respectively connected to a plurality of inverters 86 whose outputs are respectively connected to the gates of a plurality of field-effect transistors (FETs) 88. Each bit line is also connected to the drains of two PMOS transistors 100 and 102. The sources of transistors 100 and 102 are connected to the voltage reference $V_{dd}$. The output of each inverter 86 is also connected to the gate of its corresponding transistor 102. The gate of each transistor 100 is connected to its corresponding predecoded address line from group 80.

The sources of FETs 88 are tied to a common ground, and the drains are connected to the input of a single inverter 90 (i.e., the transistors 88 are connected in parallel). Two additional PMOS transistors 92 and 94 also have their drains connected to the inverter input. The sources of transistors 50 and 52 are connected to the voltage reference $V_{dd}$. The output of inverter 90 is connected to the gate of transistor 94. This circuit (transistors 88, inverter 90 and transistors 92 and 94) is a dynamic multiplexer which allows the array to be restored based on the predecoded address lines. The gate of transistor 92 is connected to the output of a NOR gate 96, with an intervening delay element 98. NOR gate 96 has four inputs, one from each predecoded address line in group 80. In other words, the output of NOR gate 96 is turned on only when all of the predecoded address lines in group 80 are turned off (all cells are idle). An appropriate value is selected for delay element 98 to prevent precharge and discharge at the same time.

After an address is decoded, only one word line will be selected. This word line will "turn on" the memory cell and either a read or a write operation will occur. When any one of the 8 exemplary word lines in a group 74 is selected, the corresponding predecoded address line in group 80 will turn off the precharge device for the group 74. After the read/write is completed, the word line is de-selected, shutting off the predecoded address line and thus turning on the precharge device. Since the rest of the word lines are not selected, the rest of the array is not accessed; the other predecoded address lines do not change state and all other precharge devices are left "on." Therefore, only the accessed segment is restored while the other segments do not change state (that is, they are left on at the restore state). When the array is not being accessed, none of the predecoded address lines are selected, and thus, all precharge devices are left at the on state. Since no circuit changes state, it does not consume power (except leakage and noise). This construction has the further advantage of protecting the array from noise inherent to a long bit line (soft errors, coupling noise, leakage). Conditional restore circuit 70 is particularly useful in the RAM design referred to as Ripple Domino Arrays, discussed in more detail in U.S. patent application Ser. Nos. 08/525,939, 08/525,444, 08/525,994 and 08/525,935, which are hereby incorporated.

Turning to FIG. 6, still another conditional restore circuit 110 is shown, which is also adapted to selectively restore a plurality of memory cells in a similar SRAM array. The depicted array uses the same type of word line decoder as shown in FIG. 5, with the 8×4 predecoded address lines. In FIG. 6, however, the predecoded lines are not part of the conditional restore circuit, so they are omitted for clarity. Each group of cells again has a bit line 112 which is connected to a similar precharge device, including another inverter 114 and two PMOS transistors 116 and 118 whose drains are connected to the input of inverter 114, and whose sources are connected to $V_{dd}$. The output of each inverter 114 is again connected to the gate of one of a plurality of FETs 120, whose sources are tied to a common ground, and whose drains are connected to the input of an inverter 122. As before, two PMOS transistors 124 and 126 also have their drains connected to the input of inverter 122, the output of inverter 122 is connected to the gate of transistor 126, and the sources of transistors 124 and 126 are connected to $V_{dd}$. Although no connection to the system clock is shown, it is understood to be at the origin of the address lines in groups 78 and 80.

The output of each inverter 114 is similarly connected to the gate of transistor 118, but the gate of each transistor 116 is connected to the output of one of a plurality of NAND gates 128. Each gate 128 has two inputs, one from the output of the corresponding inverter 114, and the other from the system clock. The system clock is also an input to an additional NAND gate 130, which controls the charge on the gate of PMOS transistor 92. The other input of NAND gate 130 is connected to the output of inverter 122.

In the method of FIG. 6, the restore is conditionally turned ON, that is, only the accessed segment is restored. Restore is only required if the circuit changes state (discharges). After a segment is accessed (read/write), data is fed back to the precharge device. If the circuit changes state (discharges to 0), the cell is restored. If the circuit does not change state, the restore circuit stays off. Since the restore device is controlled by local data, it will only turn on if its segment is accessed. When the array is in idle, no bit lines discharge and, therefore, no restore circuit will be turned on.

Figure 8:
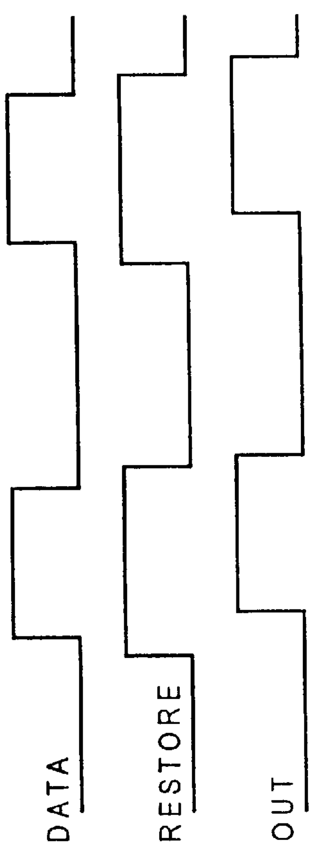
FIG. 8 is a timing diagram for the circuit of FIG. 7.
Figure 9:
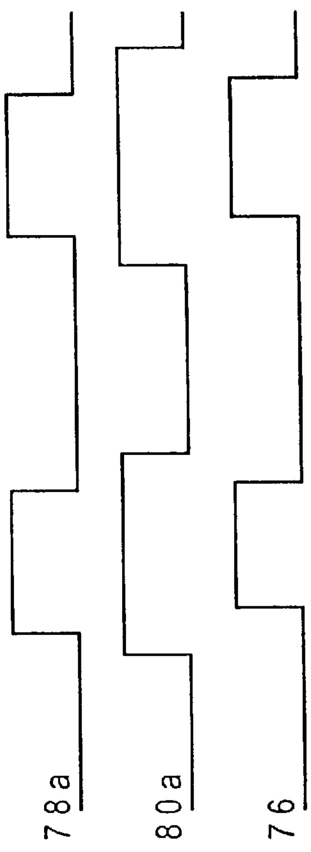
FIG. 9 is an alternative timing diagram.
Figure 7:
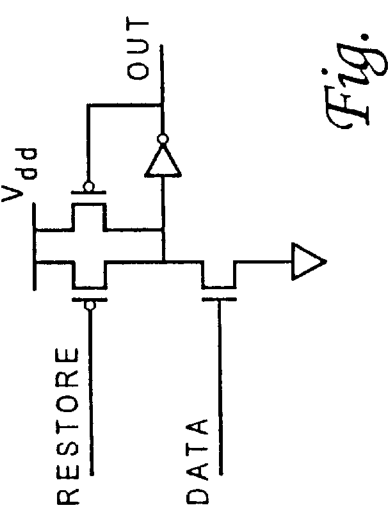
FIG. 7 is a schematic diagram of a typical timing circuit.
Figure 10:
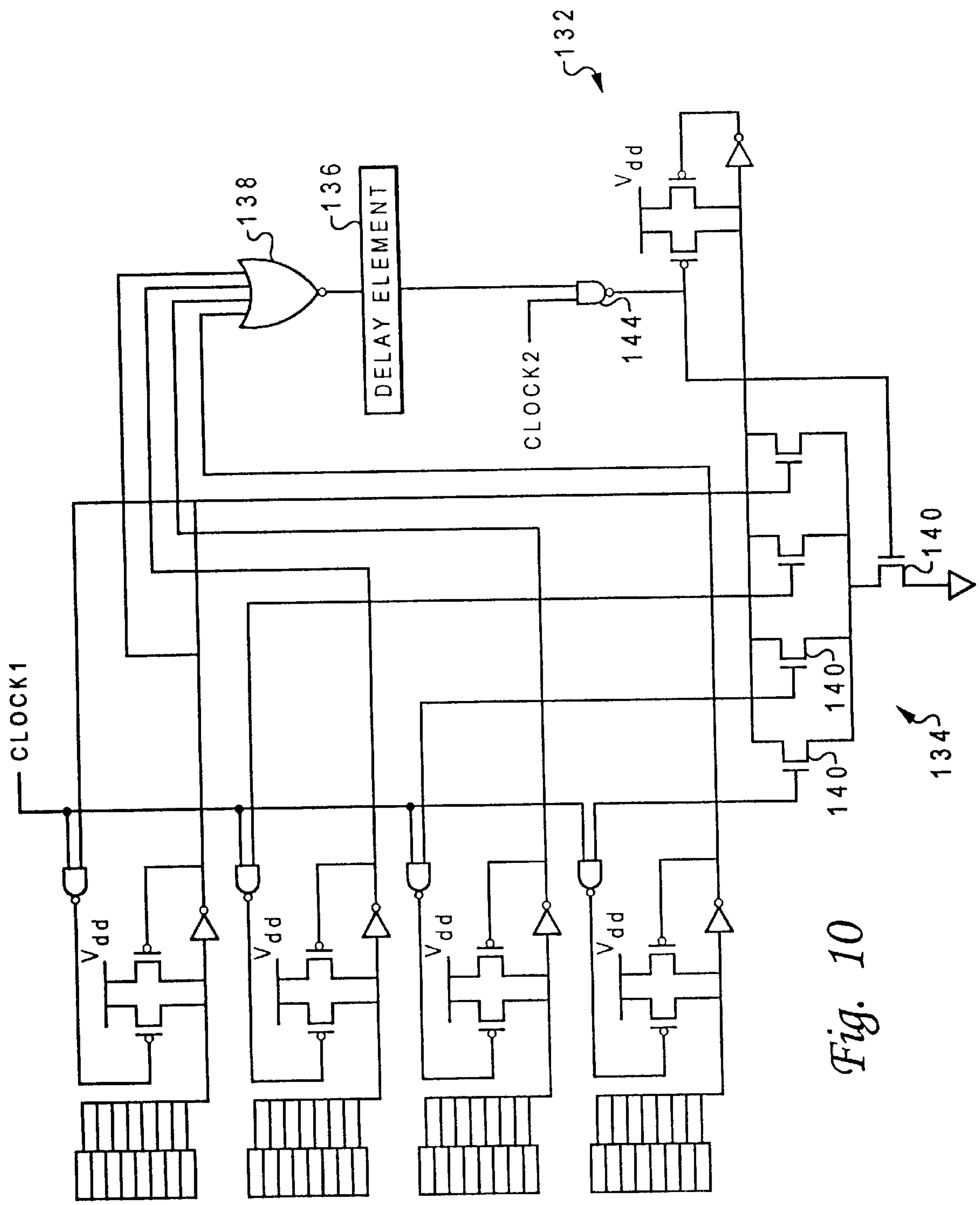
FIG. 10 is a schematic diagram similar to FIG. 6 but additionally including a ground interrupt.

In the illustrative embodiments of FIGS. 5 and 6, there will be some slight power consumption in the restore circuit due to overlap current. FIGS. 7 and 8 depict a typical restore circuit and associated timing diagram. As can be seen, the RESTORE signal goes from a low to a high state before the DATA signal goes from a low to a high state, to avoid overlap current, and the DATA signal goes from a high to a low state before the RESTORE signal goes from a high to a low state, for the same reason. It can also be seen that the OUT signal changes from a low to a high state only after both of the DATA and RESTORE signals have changed to high, but the OUT signal changes back to a low state after the RESTORE signal has changed to low. Those skilled in the art of dynamic circuit design will appreciate that there are several different modifications that can be employed to further reduce overlap current. For example, FIG. 9 illustrates how the signals on the predecoded address lines in groups 78 and 80 can be designed for further efficiency. It can be seen that the signal on the word line, such as 76, drops from a high to a low state before the signal on the associated predecoded address lines 80*a* drops from a high to a low state, so that bit line 84 will not be an active pull-down, fighting PMOS transistor 100. In an alternative example, (not shown) a pulse stretcher could be applied to the signal on predecoded address line 80*a* prior to it reaching transistor 100, causing the stretched signal to drop after the signal on the word line has dropped. A further example is shown in FIG. 10, where a "foot," or ground interrupt, is placed in the path of restore circuit 132. The circuit of FIG. 10 is similar to that of FIG. 6, but it includes the foot device 134, as well as a delay element 136 controlled by an OR gate 138 similar to that shown in FIG. 5. In this embodiment, the sources of each of the FETs 140 are connected to the drain of an NFET 142, whose source is connected to ground and whose gate is connected to the output of gate 144. This control of NFET 142 allows the restore circuit to prevent overlap current by selection of an appropriate value for delay element 136.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A device for electronically restoring an execution unit in a processor, by precharging logic components in the execution unit, the execution unit having a data input, a data output, and at least first and second operand inputs emanating, respectively, from first and second operand multiplexers which receive the data input, the device comprising:

means for evaluating the data input of the execution unit to determine whether the execution unit has performed an operation; and means, connected to said evaluating means, for restoring the execution unit if said evaluating means determines that the execution unit has performed the operation, wherein said evaluating means includes a first select line connected to said first operand multiplexer and said restoring means, and a second select line connected to said second operand multiplexer and said restoring means.

2. The device of claim 1 wherein said restoring means includes:

a precharge device connected to the execution unit; and a gate having a first input connected to an output of said evaluating means, a second input connected to a system clock, and an output connected to said precharge device.

3. The device of claim 1 wherein said restoring means includes an AND gate having a first input connected to an output of said evaluating means, a second input connected to a system clock, and an output connected to the execution unit.

4. The device of claim 1 wherein:

the data input to the execution unit has associated control logic; and said evaluating means evaluates the data input by evaluating said control logic.

5. The device of claim 3 wherein said first select line is further connected to said first input of said AND gate, and said second select line is further connected to a third input of said AND gate.

6. A conditional restore circuit for an execution unit in a computer processor, the execution unit having a data input, a data output, and at least first and second operand inputs emanating, respectively, from first and second operand multiplexers which receive the data input, the conditional restore circuit comprising:

means for evaluating the data input of the execution unit to determine whether it has performed an operation; and means, connected to said evaluating means, for restoring the execution unit if said evaluating means determines that the execution unit has performed the operation, said restoring means including gate means having a first input connected to an output of said evaluating means, a second input connected to a system clock, and an output connected to the execution unit, for activating a precharge device in the execution unit, wherein said evaluating means includes a first select line connected to said first operand multiplexer and said first input of said gate means, and a second select line connected to said second operand multiplexer and a third input of said gate means.

7. A device for electronically restoring an execution unit in a processor by precharging logic components in the execution unit, the execution unit having a data input, and having a data output in the form of a TRUE line and a COMPLEMENTARY line, the device comprising:

means for evaluating the data output of the execution unit to determine whether the execution unit has performed an operation; and means, connected to said evaluating means, for restoring the execution unit if said evaluating means determines that the execution unit has performed the operation, wherein said evaluating means includes gate means having a first input connected to said output TRUE line, a second input connected to said output COMPLEMENTARY line, and an output connected to said restoring means, for turning said restoring means on when said output TRUE and output COMPLEMENTARY lines indicate that the execution unit has performed the operation, said restoring means including an AND gate having a first input connected to an output of said evaluating means, a second input connected to a system clock, and an output connected to the execution unit.

8. The device of claim 7 wherein the execution unit has at least first and second operand inputs emanating, respectively, from first and second operand multiplexers which receive the data input, said multiplexers further being respectively connected to first and second select lines.

9. The device of claim 7 wherein said gate means comprises a NOR gate having a first input connected to said TRUE line, a second input connected to said COMPLEMENTARY line, and an output connected to said first input of said AND gate.

10. A conditional restore circuit for an execution unit in a computer processor, the execution unit having a data input, and having a data output in the form of a TRUE line and a COMPLEMENTARY line, the conditional restore circuit comprising:

means for evaluating the data output of the execution unit to determine whether it has performed an operation; and means, connected to said evaluating means, for restoring the execution unit if said evaluating means determines that the execution unit has performed the operation, said restoring means including gate means having a first input connected to an output of said evaluating means, a second input connected to a system clock, and an output connected to the execution unit, for activating a precharge device in the execution unit, wherein said evaluating means includes a NOR gate having a first input connected to said output TRUE line, a second input connected to said output COMPLEMENTARY line, and an output connected to said first input of said gate means.

* * * * *